(12) United States Patent
Wong et al.

(10) Patent No.: US 8,288,296 B2
(45) Date of Patent: Oct. 16, 2012

(54) INTEGRATED CIRCUIT WITH REPLACEMENT METAL GATES AND DUAL DIELECTRICS

(75) Inventors: Keith Kwong Hon Wong, Hopewell Junction, NY (US); Kangguo Cheng, Hopewell Junction, NY (US); Dechao Guo, Hopewell Junction, NY (US); Pranita Kulkarni, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 12/763,284

(22) Filed: Apr. 20, 2010

(65) Prior Publication Data

US 2011/0254098 A1    Oct. 20, 2011

(51) Int. Cl.
*H01L 21/31* (2006.01)
*H01L 21/469* (2006.01)

(52) U.S. Cl. ........ 438/785; 438/585; 438/154; 438/591; 438/151; 257/310; 257/369; 257/350; 257/351; 257/E27.06; 257/E21.632; 257/E21.19; 257/E27.062

(58) Field of Classification Search ............... 438/591, 438/785, 585, 154, 151; 257/310, 369, 350, 257/351, E27.06, E21.632, E21.19, E27.062
See application file for complete search history.

(56) References Cited

U.S. PATENT DOCUMENTS

| | | | |
|---|---|---|---|
| 6,107,667 A | 8/2000 | An et al. | |
| 6,348,385 B1 | 2/2002 | Cha et al. | |
| 6,777,760 B1 | 8/2004 | Jan et al. | |
| 6,972,224 B2 | 12/2005 | Gilmer et al. | |
| 6,974,736 B2 * | 12/2005 | Ku et al. | 438/197 |
| 7,091,548 B2 | 8/2006 | Jeong et al. | |
| 7,319,618 B2 | 1/2008 | Wu et al. | |
| 7,365,378 B2 | 4/2008 | Huang et al. | |
| 7,378,713 B2 | 5/2008 | Hsu et al. | |
| 7,495,290 B2 | 2/2009 | Li | |
| 2011/0223752 A1* | 9/2011 | Hing et al. | 438/585 |

OTHER PUBLICATIONS

Jemin Park, Chenming Hu; Gate Last MOSFET with Air Spacer and Self-Aligned Contacts for Dense Memories; International Symposium on VLSI Technology, Systems, and Applications, Apr. 27-29, 2009; pp. 105-106.

* cited by examiner

*Primary Examiner* — Tom Thomas
*Assistant Examiner* — Benjamin Tzu-Hung Liu
(74) *Attorney, Agent, or Firm* — Howard M. Cohn; H. Daniel Schnurmann

(57) ABSTRACT

A replacement gate structure and method of fabrication are disclosed. The method provides for fabrication of both high performance FET and low leakage FET devices within the same integrated circuit. Low leakage FET devices are fabricated with a hybrid gate dielectric comprised of a low-K dielectric layer and a high-K dielectric layer. High performance FET devices are fabricated with a low-K gate dielectric.

15 Claims, 8 Drawing Sheets

_US 8,288,296 B2_

INTEGRATED CIRCUIT WITH REPLACEMENT METAL GATES AND DUAL DIELECTRICS

FIELD OF THE INVENTION

The present invention is related to integrated circuit fabrication and more particularly to a structure and method for making an integrated circuit with replacement metal gates.

BACKGROUND OF THE INVENTION

Semiconductor technology and chip manufacturing advances have resulted in a steady increase of on-chip clock frequencies, the number of transistors on a single chip and the die size itself, coupled with a corresponding decrease in chip supply voltage and chip feature size. Generally, all other factors being constant, the power consumed by a given clocked unit increases linearly with the frequency of switching within it. Thus, not withstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, net power consumption reduction is important but, without degrading performance below acceptable levels.

To minimize power consumption, most integrated circuits (ICs) used in such low end systems (and elsewhere) are made in the well-known complementary insulated gate field effect transistor (FET) technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a closed switch), the other device (the PFET) is off, not conducting (ideally modeled as an open switch) and, vice versa.

For example, a CMOS inverter is a series connected PFET and NFET pair that are connected between a power supply voltage ($V_{dd}$) and ground (GND). Both are gated by the same input and both drive the same output, the PFET pulling the output high and the NFET pulling the output low at opposite input signal states. Ideally, when the gate of a NFET is below some positive threshold voltage ($V_t$) with respect to its source, the NFET is off, i.e., an open switch. Above $V_t$, the NFET is on conducting current, i.e., the switch is closed. Similarly, a PFET is off when its gate is above its $V_t$, i.e., less negative, and on below $V_t$. Thus, ideally, the CMOS inverter in particular and CMOS circuits in general pass no static (DC) current. Therefore, ideal CMOS circuits use no static or DC power and only consume transient power from charging and discharging capacitive loads.

Some applications, such as logic circuits for general and special purpose processors, require a High Performance (HP) FET that is capable of fast transitions. In other applications, power consumption is of concern, especially for portable electronic devices that operate with battery power. For such applications, FET leakage can become a substantial source of power consumption, even when such a device is in a standby state. In these situations a Low Leakage (LL) FET is desirable.

Modern electronic devices may include instances where a combination of High Performance (HP) FETs and Low Leakage (LL) FETs are necessary. Therefore, it is desirable to have an improved structure and method for fabricating a combination of HP FETs and LL FETs on a single integrated circuit (IC).

SUMMARY

In one embodiment of the present invention, a semiconductor structure has a plurality of replacement-gate field effect transistors. The plurality of replacement-gate field effect transistors include at least a first transistor and a second transistor. Each transistor further includes a metal gate, the metal gate comprising sidewalls. The first transistor has a gate dielectric comprised of a low-K material. The gate dielectric of the first transistor is disposed underneath the metal gate and also disposed on the sidewalls of the metal gate. The second transistor has a hybrid gate dielectric comprised of a first layer of low-K dielectric material, and a second layer of high-K dielectric material disposed on the first layer of low-K dielectric material. The gate dielectric of the second transistor is disposed underneath the metal gate and also disposed on the sidewalls of the metal gate of the second transistor.

In another embodiment of the present invention, a method for fabricating a plurality of replacement gate transistors includes the following steps. An insulating layer is applied over a semiconductor structure having a plurality of horizontal surfaces, a plurality of sidewall surfaces, a plurality of active areas, and a plurality of temporary gate structures disposed over the active areas of a semiconductor substrate. The insulating layer is disposed upon both the horizontal surfaces and the sidewall surfaces. A portion of the insulating layer is removed so that the insulating layer remains only on the sidewall surfaces. A nitride liner is deposited on the semiconductor substrate so that the nitride liner is disposed upon both horizontal surfaces and sidewall surfaces. An oxide layer is deposited on the nitride liner. The oxide layer is planarized so that the temporary gate structures are exposed. The temporary gate structures are removed. A low-K dielectric is deposited on the semiconductor structure so that the low-K dielectric is disposed on both horizontal surfaces and sidewall surfaces. A portion of the low-K dielectric is removed whereby the low-K dielectric remains only on the sidewall surfaces and on the portion of the semiconductor substrate covered by a deposited photoresist layer. A high-K dielectric is deposited on the semiconductor structure so that the high-K dielectric is disposed upon both horizontal surfaces and sidewall surfaces. A metal layer is deposited on the high-K dielectric. The metal layer is planarized whereby the oxide layer is exposed.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 shows a prior art semiconductor structure which is the starting point for a method according to an embodiment of the present invention.

FIGS. 2-10 show a semiconductor structure after subsequent processing steps of a method according to an embodiment of the present invention.

FIG. 11A shows a semiconductor structure according to an embodiment of the present invention.

FIG. 11B shows details of the Low Leakage FET of FIG. 11A.

FIG. 11C shows details of the High Performance FET of FIG. 11A.

FIG. 12 is a flowchart indicating process steps for a method in accordance with an embodiment of the present invention.

DETAILED DESCRIPTION

Figure 1:
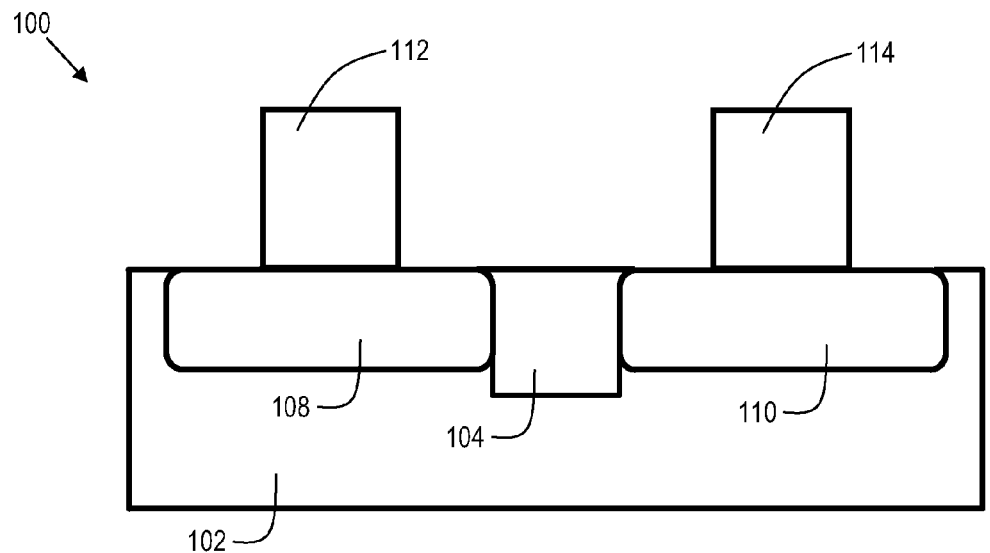

FIG. 1 shows a prior art semiconductor structure 100 which is the starting point for a method according to an embodiment of the present invention. Structure 100 comprises silicon substrate 102 comprising active areas 108 and 110. Active areas (AA) are regions of a substrate on which transistors are located, once the fabrication process is complete. Shallow Trench Isolation (STI) region 104 is disposed between active area 108 and active area 110. Gates 112 and 114, comprised of polysilicon are disposed on active areas 108 and 110, respectively.

Figure 2:
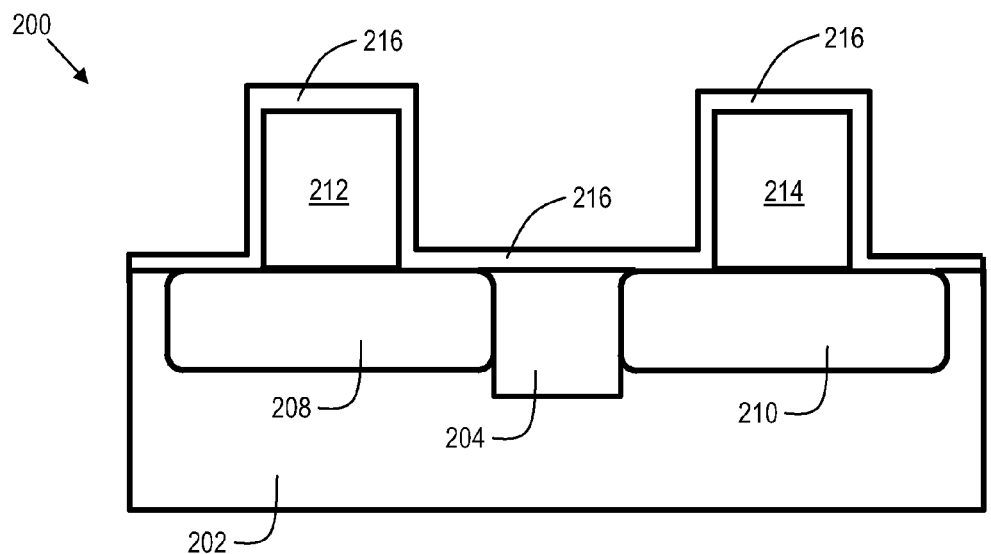

FIG. 2 shows a semiconductor structure 200 after a subsequent processing step. In this step, insulating layer 216 is disposed over the semiconductor structure 200. In one embodiment, insulating layer 216 is comprised of oxide or nitride, and is deposited via chemical vapor deposition (CVD), Plasma Enhanced Chemical Vapor Deposition (PECVD), or atomic layer deposition (ALD). The insulating layer is conformal, in that it is deposited on, and adheres to, both horizontal and sidewall (vertical) surfaces of the semiconductor structure 200. As stated previously, similar elements may be referred to by similar numbers in various figures (FIGs) of the drawing, in which case typically the last two significant digits may be the same. For example, STI region 204 of FIG. 2 is similar to STI region 104 of FIG. 1. Gates 212 and 214 are temporary gate structures that will be removed and replaced with metal gates in subsequent processing steps.

Figure 3:
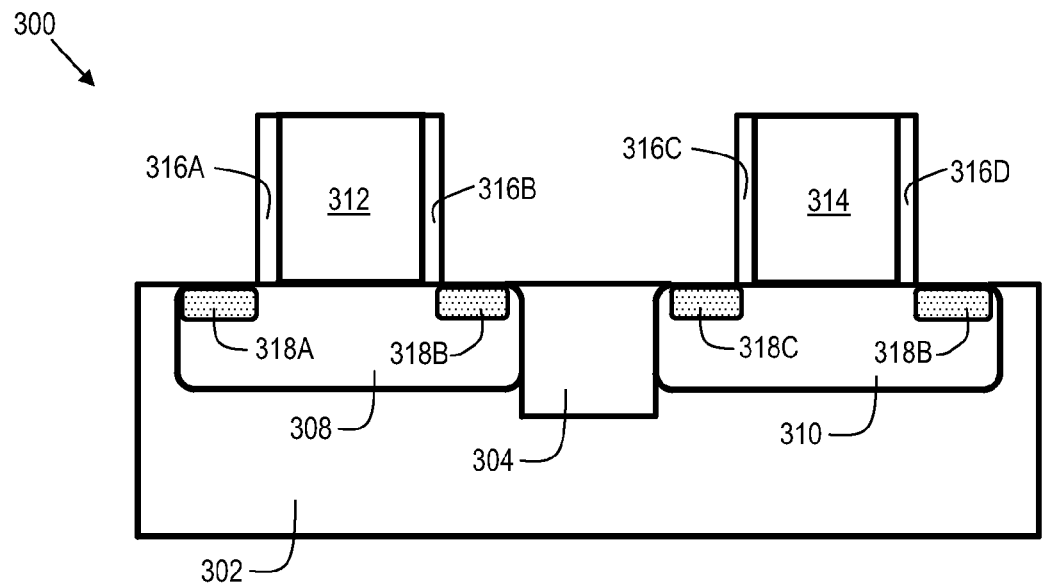

FIG. 3 shows a semiconductor structure 300 after additional processing steps. An etch process is applied to insulating layer 216 (see FIG. 2) such that most of the insulating layer 216 is removed, with the only part of the layer remaining being on the sidewalls of the gates 312 and 314. This remaining part of the layer forms spacers 316A, 316B, 316C and 316D. Silicide regions 318A, 318B, 318C, and 318D are formed using standard industry methods, which later serve as contact points for connecting the semiconductor structure to other devices within a complete integrated circuit.

Figure 4:
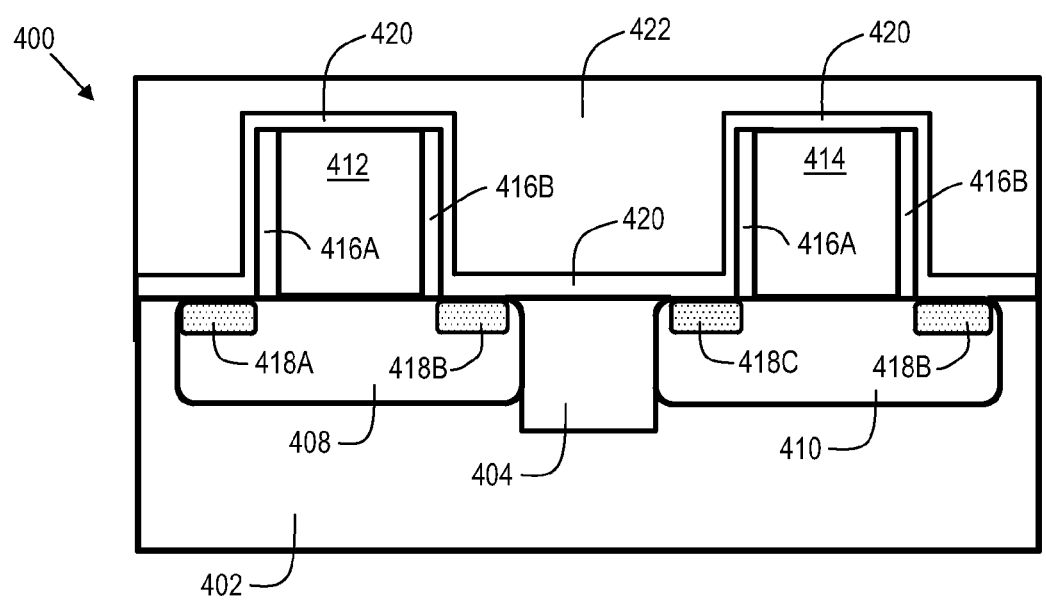

FIG. 4 shows a semiconductor structure 400 after additional processing steps. A nitride liner 420 is disposed over the semiconductor structure 400. The nitride liner 420 may be applied by any suitable method, including, but not limited to, CVD, PECVD, and ALD. An oxide layer 422 is then deposited over the nitride liner 420. In one embodiment, the oxide layer 422 is an un-doped silica glass (USG) oxide.

Figure 5A:
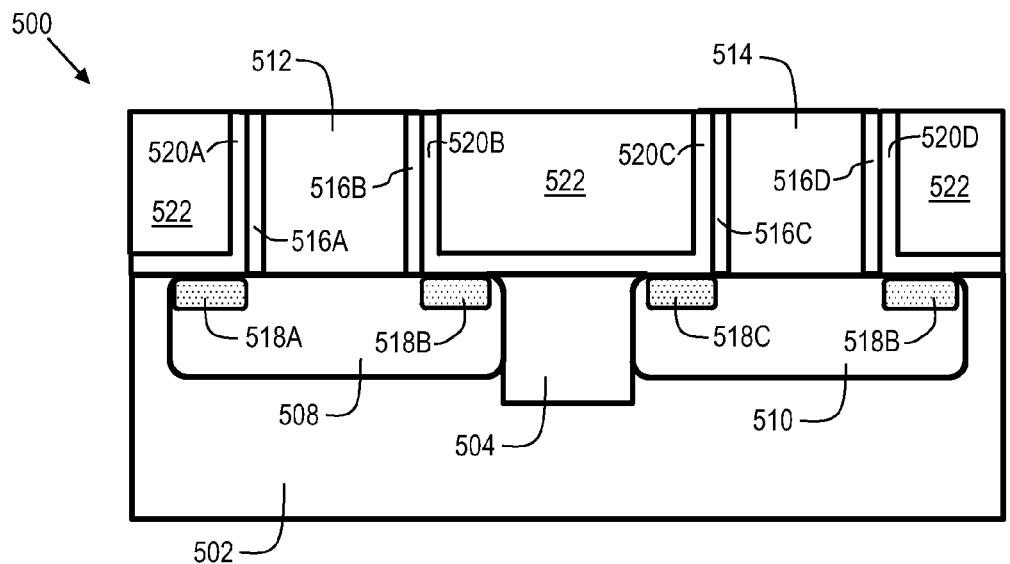

FIG. 5A shows a semiconductor structure 500 after additional processing steps. The oxide layer (422 of FIG. 4) is planarized to expose temporary gate structures 512 and 514. In one embodiment, a chemical mechanical polish (CMP) is applied to the oxide to planarize the top surface and expose the gate structures 512 and 514, which are comprised of polysilicon. Optionally, prior to performing CMP, an etch may be used to reduce the thickness of the oxide layer (see layer 422 of FIG. 4). In one embodiment, the etch is a reactive ion etch (RIE). In another embodiment, the etch is a wet etch. Oxide regions 522 still remain and portions of nitride liner (420 of FIG. 4) remain and serve as additional spaces (520A, 520B, 520C, and 520D).

Figure 5B:
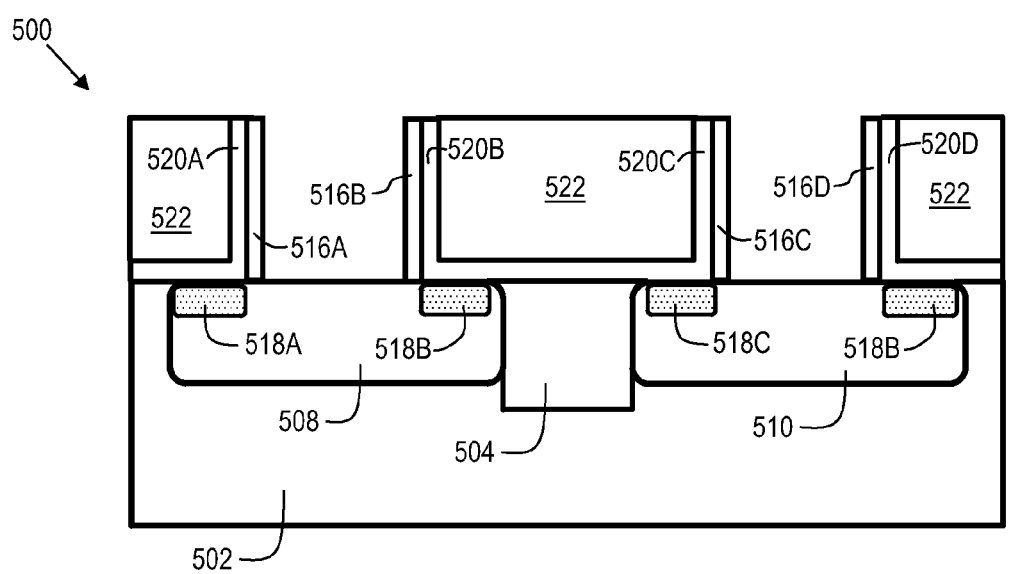

FIG. 5B shows the semiconductor structure 500 of FIG. 5A after removal of the temporary gate structures 512 and 514. Polysilicon gate structures 512 and 514 are removed via a selective etch process, which removes the gate structures while allowing spacers 516A, 516B, 516C, and 516D to remain. Oxide regions 522 also remain after the etch is complete. In one embodiment, the etch process is performed with a wet etch. In one embodiment, the wet etch is performed with Tetra-Methyl Ammonium Hydroxide (TMAH). In another embodiment, the wet etch is performed with warm ammonium hydroxide.

Figure 6:
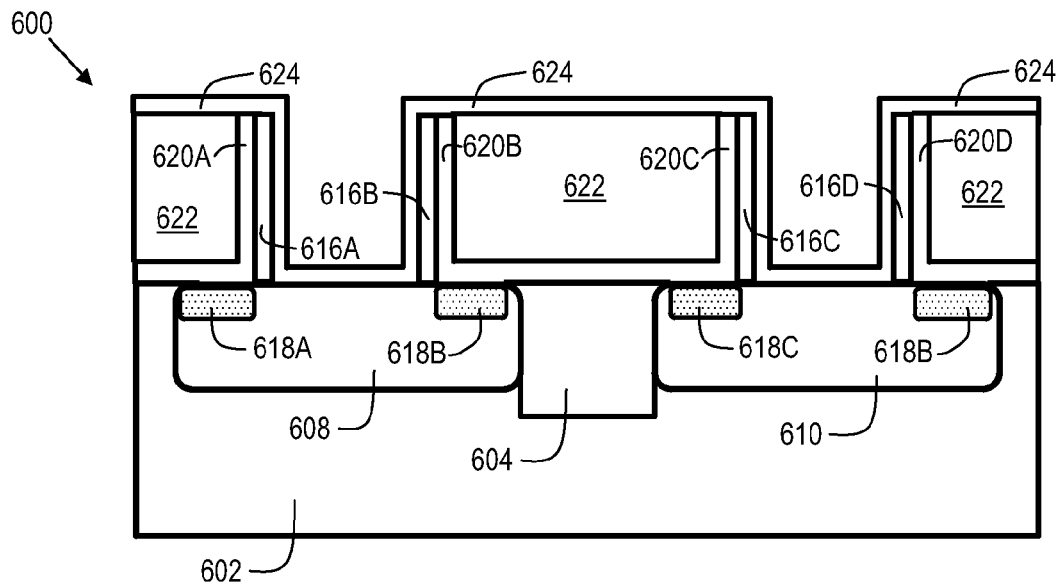

FIG. 6 shows a semiconductor structure 600 after additional processing steps. A low-K dielectric 624 is disposed over the semiconductor structure 600. The low-K dielectric is disposed on both horizontal surfaces and sidewall surfaces. In a preferred embodiment, the low-K dielectric 624 is comprised of nitride, and has a dielectric constant (K) ranging from about 3 to about 10. In one embodiment, nitride that forms the low-K dielectric 624 is deposited via CVD, ALD, or a spin-on deposition process.

Figure 7:
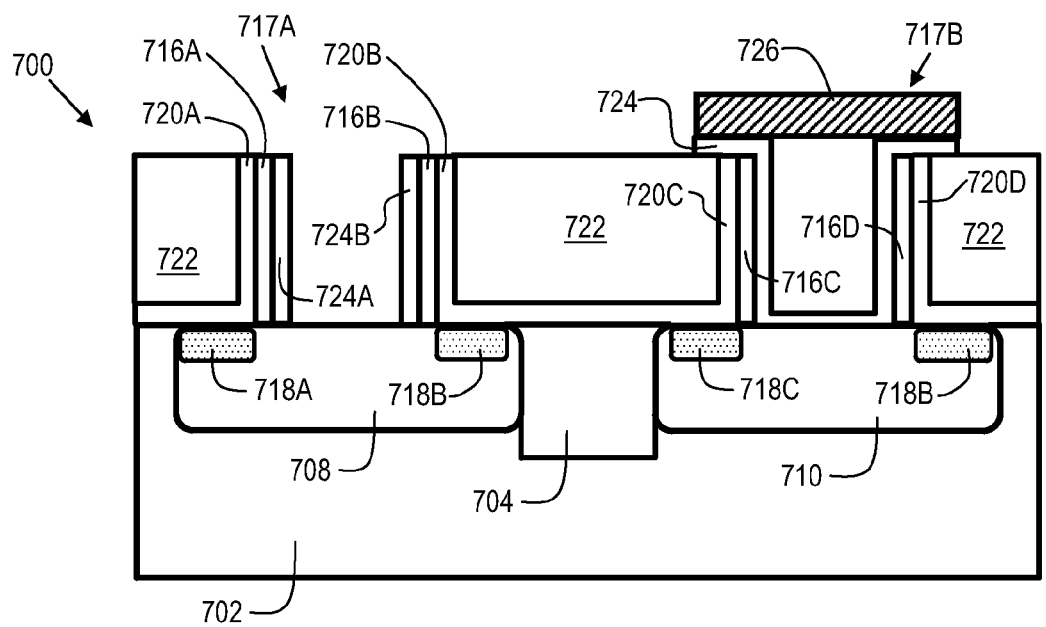

FIG. 7 shows a semiconductor structure 700 after additional processing steps. Photoresist layer 726 is applied over a portion of the semiconductor structure. As shown in FIG. 7, the photoresist is deposited over the rightmost transistor area (an area where a transistor will ultimately be formed, indicated as reference 717B), also covering spacers 720C, 716C, 716D, and 720C. Transistor area 717A is left in an exposed state, with no photoresist covering it. An etch process then removes the low-K dielectric layer from most of the surfaces. In one embodiment, the etch is performed via an RIE process. After the etch, the only areas where low-K dielectric remains is region 724, which is underneath photoresist layer 726, and spacers 724A and 724B, which remain on sidewalls of transistor area 717A.

Figure 8:
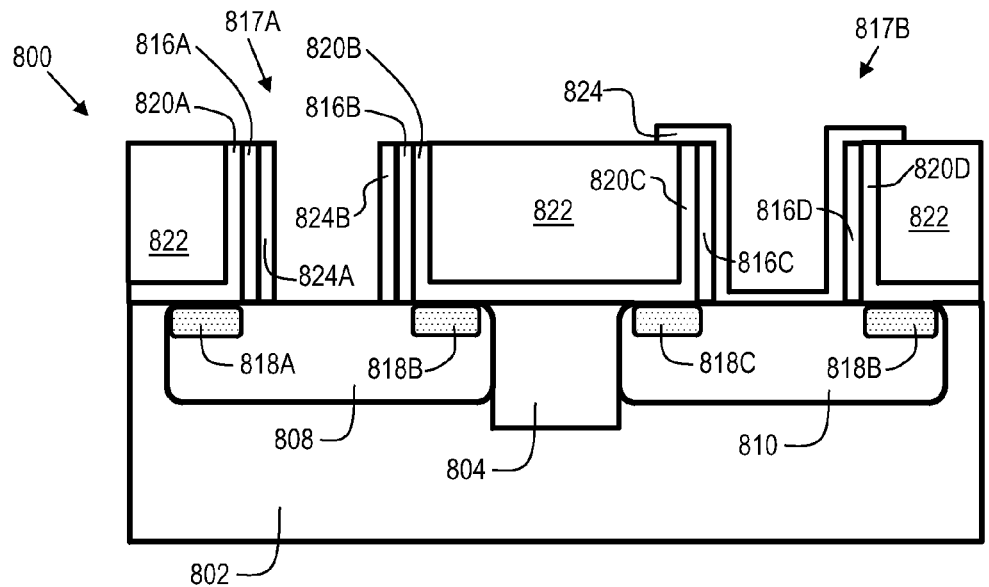

FIG. 8 shows a semiconductor structure 800 after additional processing steps. The photoresist layer is removed (see layer 726 of FIG. 7).

Figure 9:
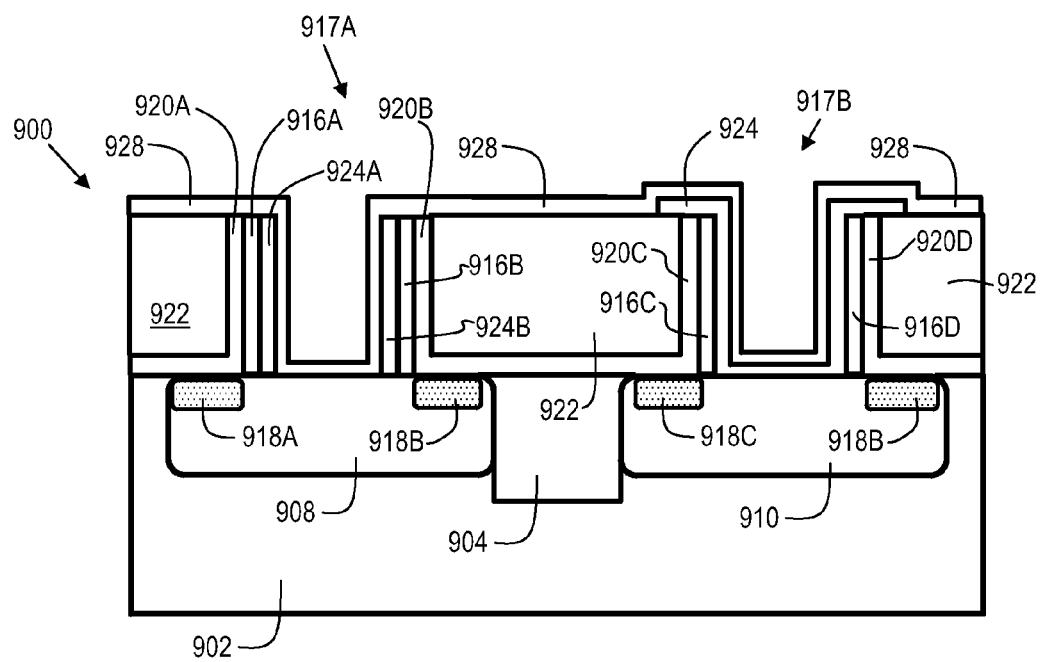

FIG. 9 shows a semiconductor structure 900 after additional processing steps. A high-K dielectric 928 is disposed over the semiconductor structure 900. The high-K dielectric 928 is disposed on both horizontal surfaces and sidewall surfaces. In a preferred embodiment, the high-K dielectric 928 is comprised of a material from the group consisting of hafnium silicate, zirconium silicate, hafnium oxide and zirconium oxide. In one embodiment, high-K dielectric has a dielectric constant (K) ranging from about 10 to about 30. In one embodiment, the nitride is deposited via CVD or ALD.

Figure 10:
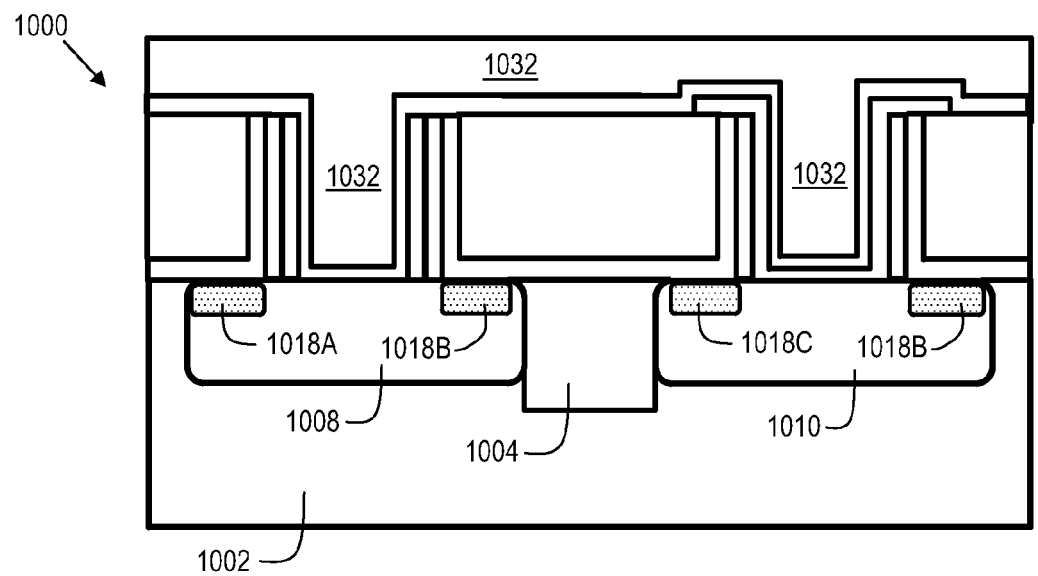

FIG. 10 shows a semiconductor structure 1000 after additional processing steps. Metal layer 1032 is deposited over the semiconductor structure 1000. The material used metal layer 1032 depends upon the type of FETs that are being fabricated, as the methods disclosed herein can be used for both PFET and NFET fabrication. For NFET fabrication, an aluminum based compound such as TiAlN may be used. For PFET fabrication, Titanium Nitride (TiN) may be used, for example.

Figure 11A:
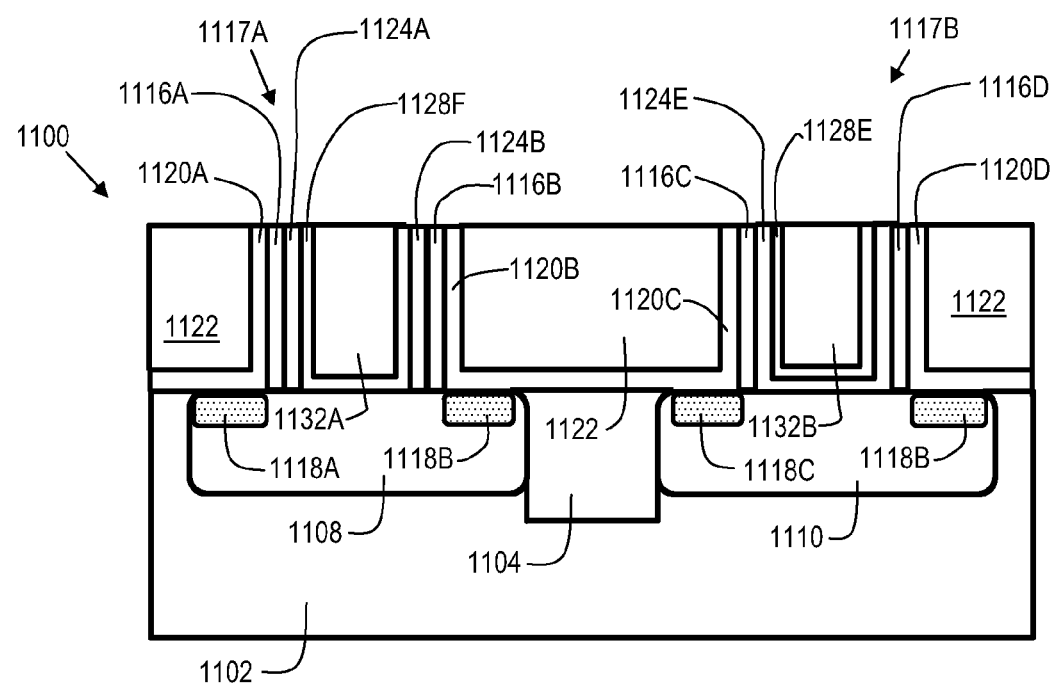

FIG. 11A shows a semiconductor structure 1100 upon completion of processing steps of a method according to an embodiment of the present invention. The metal layer is planarized to a level sufficient to expose oxide layer 1122. In one embodiment, a CMP is performed to planarize the top surface of semiconductor structure 1100. From this point forward, conventional processing is used to complete the fabrication of the integrated circuit. Transistor area 1117A comprises part of a high performance (HP) FET, and transistor area 1117B comprises part of a low leakage (LL) FET.

Figure 11B:
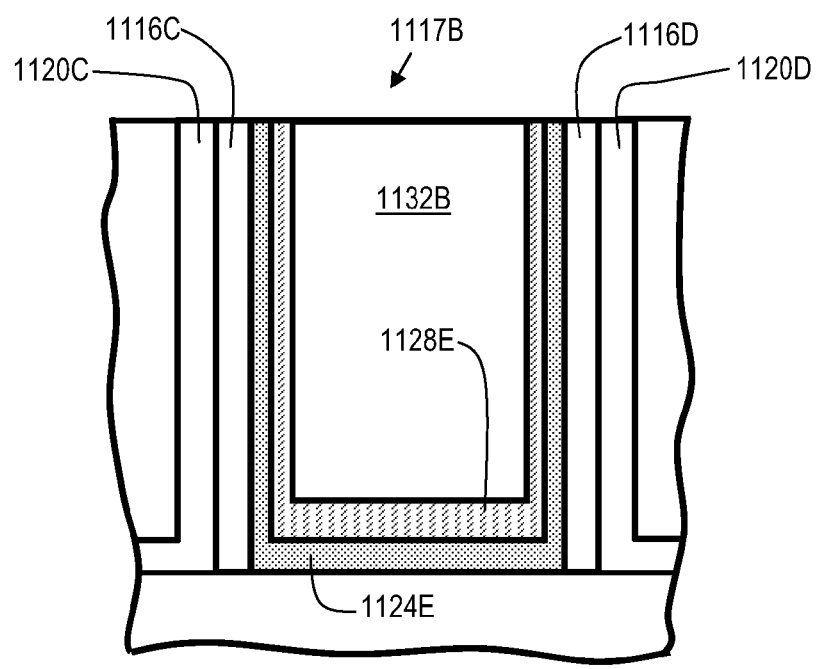
Figure 11C:
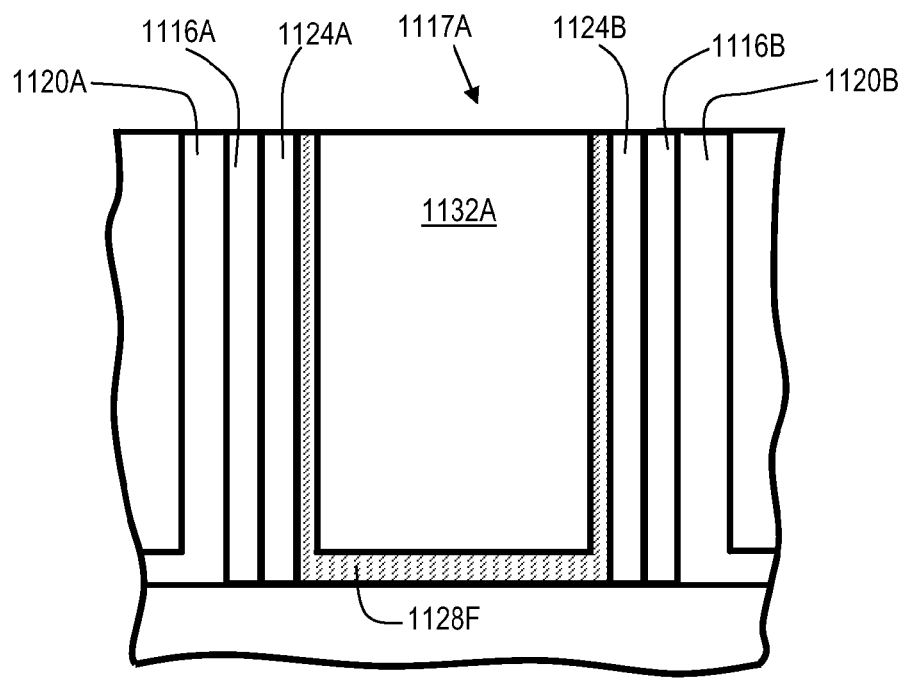

Transistor area 1117A has high-K dielectric layer 1128F which forms a "cup shape" around the gate, as it is disposed along both the sidewalls and bottom of metal gate structure 1132A. Additional spacers 1124A, 1124B, 1120A, and 1120B serve to reduce capacitance coupling between the gate and source/drain regions of the transistor that will be formed using gate structure 1132A upon completion of the fabrication process. FIG. 11C shows additional detail of gate structure 1132A.

Transistor area 1117B has high-K dielectric layer 1128E, and low-K dielectric layer 1124E which forms a "cup shape" disposed along the sides and bottom of metal gate structure 1132B. Additional spacers 1116C, 1116D, 1120C, and 1120D serve to reduce capacitance coupling between the gate and source/drain regions of the transistor that will be formed using gate structure 1132B upon completion of the fabrication process. FIG. 11B shows additional detail of gate structure 1132B.

Figure 12:
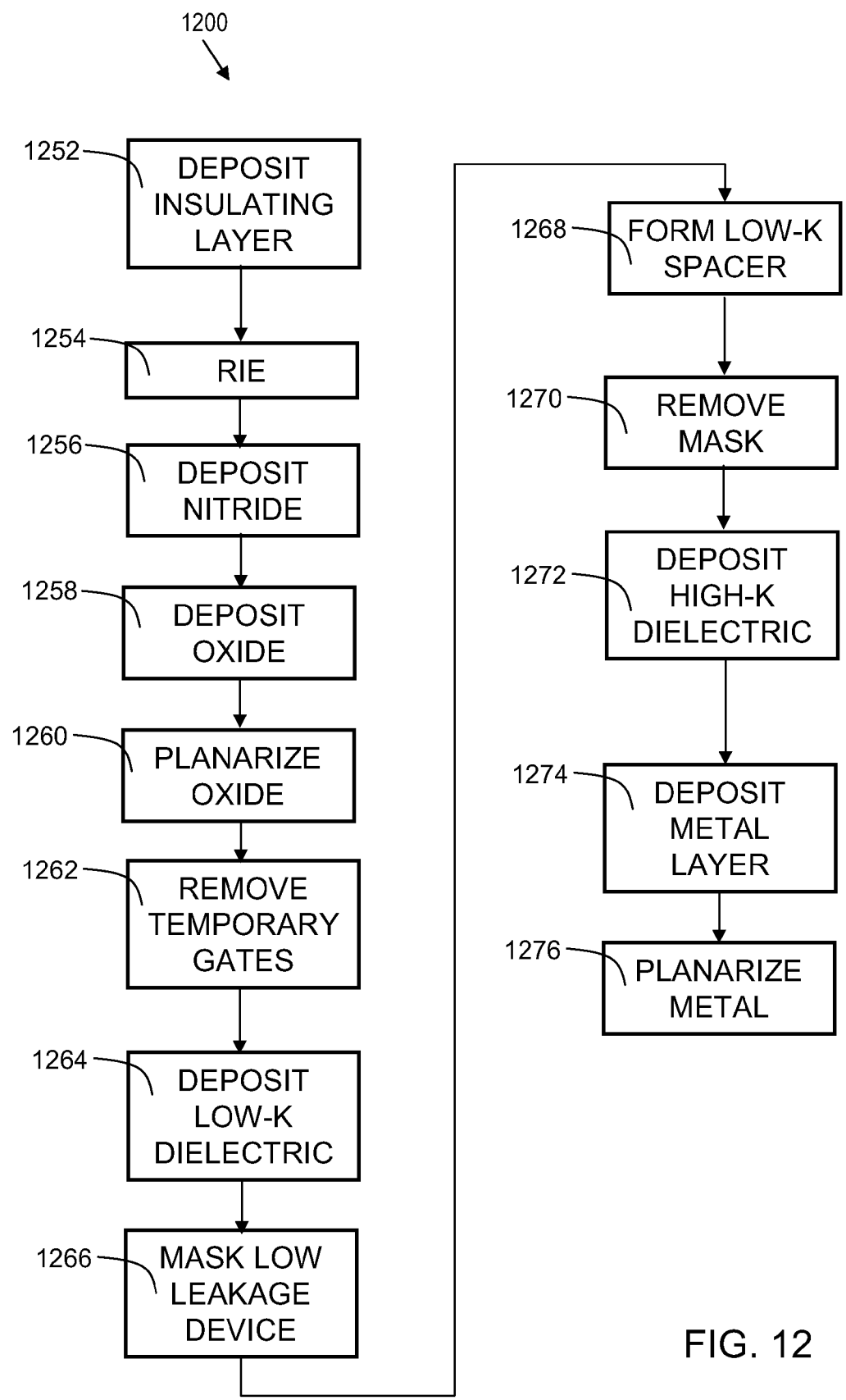

FIG. 12 is a flowchart 1200 indicating process steps for a method in accordance with an embodiment of the present invention. In process step 1252 an insulating layer is deposited over a semiconductor substrate. In process step 1254, a reactive ion etch is performed to remove a portion of the insulating layer deposited in process step 1252, thereby forming spacers. In process step 1256, a nitride liner is deposited over the semiconductor substrate. In process step 1258, an oxide layer is deposited over the semiconductor substrate. In process step 1260, the oxide is planarized, exposing temporary gate structures. In process step 1262, the temporary gate structures are removed via a selective etch. In process step 1264, a low-K dielectric layer is deposited over the semiconductor substrate. In process step 1266, the low leakage transistor area is masked with a photoresist layer. In process step 1268, an etch is performed to form a low-K spacer for the high performance transistor area. In process step 1270, the photoresist (mask) is removed. In process step 1272, a high-K dielectric layer is deposited. In process step 1274, a metal layer is deposited over the semiconductor substrate. A portion of the metal layer forms the gates of the transistors of the completed integrated circuit (IC). In process step 1276, the metal layer is planarized, preferably via CMP. From this point forward, standard processes that are well-known in the industry are used to complete the fabrication of the semiconductor substrate to form a completed integrated circuit.

As can now be appreciated, embodiments of the present invention provide numerous advantages over prior art structures and methods. One advantage is that this process is a gate-last process that produces both high performance and low leakage FETs simultaneously. The term "gate-last" has the customary meaning, namely, that the gate of the device is fabricated after the source and drain of the device have been activated. In the gate-last case the metal gates do not receive the thermal budget that is needed for activating the source and the drain, consequently, the stress in the metal layers remains at the as-deposited level. In FET processing, typically the largest temperature budgets, meaning temperature and time exposure combinations, are reached during source/drain fabrication. Since, in embodiments of the present invention, the sources and drains have already been fabricated for the gate-last approach when the stressed metal is deposited, such high temperature fabrication steps have already been performed, and the structure will not have to be exposed to a further "high temperature" budget treatment.

Another such advantage is the low K dielectric inner spacer on the gate sidewalls, which provide reduced capacitive coupling between the gate and source/drain regions, thereby improving performance.

Semiconductors produced by the disclosed methods also provide advantages over devices with so-called "air gap" spacers, in that the low-K dielectric provides a mechanically stronger structure than an air gap, and is also more stable over time, as gases trapped in an air gap may induce property changes over time, and critical parameters such as Vt (Threshold Voltage) can shift. The semiconductor structures of embodiments of the present invention provide both a high performance FET and a low leakage FET on the same chip wherein the high performance FET has a low-K spacer and the low leakage FET has a hybrid (both low-K and high-K layers) gate dielectric.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for fabricating a first replacement gate transistor and a second replacement gate transistor, comprising the steps of:

applying an insulating layer over a semiconductor structure, the semiconductor structure comprising a plurality of horizontal surfaces, a plurality of sidewall surfaces, a plurality of active areas, and a first temporary gate structure and a second temporary gate structure disposed over the active areas of a semiconductor substrate, whereby the insulating layer is disposed upon both the horizontal surfaces and the sidewall surfaces;

removing a portion of the insulating layer, whereby the insulating layer remains only on the sidewall surfaces;

depositing a nitride liner on the semiconductor substrate, whereby the nitride liner is disposed upon both horizontal surfaces and sidewall surfaces of the first temporary gate structure and the second temporary gate structure;

depositing an oxide layer on the nitride liner;

planarizing the oxide layer, whereby the first temporary gate structure and the second temporary gate structure are exposed;

removing the first temporary gate structure and second temporary gate structures;

depositing a low-K dielectric on the semiconductor structure, whereby the low-K dielectric is disposed on both horizontal surfaces and sidewall surfaces;

removing a portion of the low-K dielectric, whereby the low-K dielectric remains only on the sidewall surfaces of the first replacement gate transistor, and the low-K dielectric remains in a cup shape on the second replacement gate transistor;

depositing a high-K dielectric on the semiconductor structure, including the low-K dielectric in a cup shape on the second replacement gate transistor, whereby the high-K dielectric is disposed upon both horizontal surfaces and sidewall surfaces of the first replacement gate transistor and second replacement gate transistor;

depositing a metal layer on the high-K dielectric; and planarizing the metal layer, whereby the oxide layer is exposed, and whereby the first replacement gate transistor has a first gate, and the second replacement gate transistor has a second gate, wherein a high-K dielectric is disposed along the sides and the bottom of the first gate and a hybrid gate dielectric is disposed along the sides and the bottom of the second gate.

2. The method of claim 1, wherein the step of applying an insulating layer comprises applying a layer of nitride.

3. The method of claim 1, wherein the step of removing the first temporary gate structure and a second temporary gate structure is performed via a wet etch.

4. The method of claim 3, wherein the step of performing a wet etch utilizes wet etch is performed with a material selected from the group consisting of Tetra-Methyl Ammonium Hydroxide (TMAH) and warm ammonium hydroxide.

5. The method of claim 1, wherein the step of depositing an oxide layer comprises depositing an un-doped silica glass oxide.

6. The method of claim 1, wherein the step of planarizing the oxide layer is performed via a chemical mechanical polish process.

7. The method of claim 6, further comprising the step of performing a wet etch.

8. The method of claim 1, wherein the step of depositing a low-K dielectric is performed via chemical vapor deposition.

9. The method of claim 1, wherein the step of depositing a low-K dielectric is performed via atomic layer deposition.

10. The method of claim 1, wherein the step of depositing a low-K dielectric is performed via a spin-on deposition process.

11. The method of claim 1, wherein the step of depositing a low-K dielectric comprises depositing a low-K dielectric comprised of nitride.

12. The method of claim 11, wherein the step of depositing a low-K dielectric comprises depositing a dielectric having a dielectric constant ranging from about 3 to about 10.

13. The method of claim 1, wherein the step of removing a portion of the low-K dielectric is performed via a reactive ion etch process.

14. The method of claim 1, wherein the step of depositing a high-K dielectric is performed via atomic layer deposition.

15. The method of claim 1, wherein the step of depositing a high-K dielectric is performed via chemical vapor deposition.

* * * * *